(12) United States Patent
Gu et al.

(10) Patent No.: US 12,323,117 B2
(45) Date of Patent: Jun. 3, 2025

(54) POST DRIVER HAVING VOLTAGE PROTECTION

(71) Applicant: SigmaStar Technology Ltd., Fuijan (CN)

(72) Inventors: Yin-Yin Gu, Shanghai (CN); Ze-Wei He, Shanghai (CN); Zhao-Qi Xu, Shanghai (CN); Kai Sun, Shanghai (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 290 days.

(21) Appl. No.: 17/899,020

(22) Filed: Aug. 30, 2022

(65) Prior Publication Data
US 2023/0208371 A1 Jun. 29, 2023

(30) Foreign Application Priority Data

Dec. 29, 2021 (CN) .......................... 202111639944.X

(51) Int. Cl.
*H03F 3/45* (2006.01)
*H03F 1/52* (2006.01)

(52) U.S. Cl.
CPC ......... *H03F 3/45654* (2013.01); *H03F 1/523* (2013.01); *H03F 3/45183* (2013.01)

(58) Field of Classification Search
CPC .. H03F 3/45654; H03F 1/523; H03F 3/45183; H03F 2203/45008; H03F 2203/45302; H03F 2203/45424; H03F 3/45188; H03F 3/45677
USPC .................................................. 330/253, 254
See application file for complete search history.

(56) References Cited

U.S. PATENT DOCUMENTS 10,958,248 B1 * 3/2021 You ..................... H03F 3/45273

* cited by examiner

*Primary Examiner* — Andrea Lindgren Baltzell
*Assistant Examiner* — Khiem D Nguyen
(74) *Attorney, Agent, or Firm* — Edell, Shapiro & Finnan, LLC

(57) ABSTRACT

A post driver includes an input pair circuit, a protection circuit, a common mode sensing circuit and an amplifier. The input pair circuit outputs a first signal through a first node and outputs a second signal through a second node according to a first input signal and a second input signal. The protection circuit provides the input pair circuit with voltage protection according to multiple first bias voltages and a second bias voltage, transmits the first signal to a first load to generate a first output signal, and transmits the second signal to a second load to generate a second output signal. The common mode sensing circuit senses a level of the first node and a level of the second node to generate a feedback signal. The amplifier generates the second bias voltage according to a reference signal and the feedback signal.

6 Claims, 3 Drawing Sheets

POST DRIVER HAVING VOLTAGE PROTECTION

This application claims the benefit of China application Serial No. CN202111639944.X, filed on Dec. 29, 2021, the subject matter of which is incorporated herein by reference.

BACKGROUND OF THE INVENTION

Field of the Invention

The present application relates to a post driver, and more particularly, to a post driver having voltage protection.

Description of the Related Art

Post drivers are common in transmitters, and can be used to output differential signals having greater swings. In practice, limited by the types that can be provided by manufacturing processes, transistor having a lower withstand voltage may be needed to implement a post driver. However, these transistors may be damaged due to a larger voltage difference, leading to an operation error of the post driver.

SUMMARY OF THE INVENTION

In some embodiments, a post driver includes an input pair circuit, a protection circuit, a common mode sensing circuit and an amplifier. The input pair circuit outputs a first signal through a first node and outputs a second signal through a second node according to a first input signal and a second input signal. The protection circuit provides the input pair circuit with voltage protection according to multiple first bias voltages and a second bias voltage, transmits the first signal to a first load to generate a first output signal, and transmits the second signal to a second load to generate a second output signal. The common mode sensing circuit senses a level of the first node and a level of the second node to generate a feedback signal. The amplifier generates the second bias voltage according to a reference signal and the feedback signal.

In some embodiments, a post driver includes multiple driving circuits, a common mode sensing circuit and an amplifier. The multiple driving circuits respectively correspond to multiple taps, generate, according to multiple sets of input signals, a first output signal through a first load and a second output signal through a second load, wherein each of the multiple driving circuits includes an input pair circuit and a protection circuit. The input pair circuit outputs, according to a first input signal and a second input signal of a corresponding one among the multiple sets of input signals, a first signal through a first node and a second signal through a second node. The protection circuit provides the input pair circuit with voltage protection according to multiple first bias voltages and a second bias voltage, transmits the first signal to the first load, and transmits the second signal to the second load. The common mode sensing circuit generates a feedback signal according to a level of the first node of a corresponding driving circuit among the multiple driving circuits and a level of the second node of the corresponding driving circuit. The amplifier generates the second bias voltage according to a reference signal and the feedback signal.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope and meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
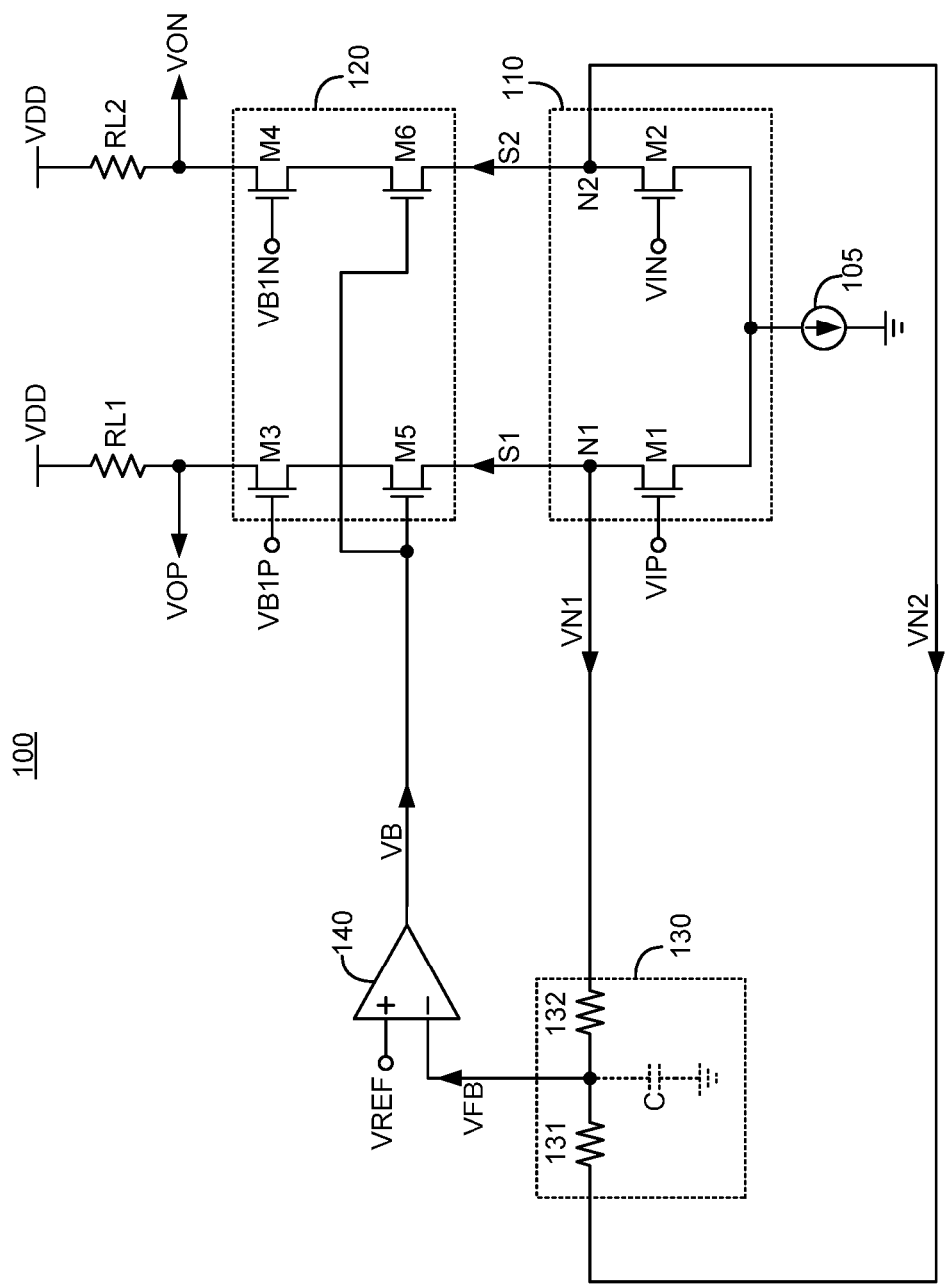
FIG. 1 is a schematic diagram of a post driver according to some embodiments of the present application.

FIG. 1 shows a schematic diagram of a post driver 100 according to some embodiments of the present application. In some embodiments, the post driver 100 can be applied (but not limited) to a transmitter.

The post driver 100 includes an input pair circuit 110, a protection circuit 120, a common mode sensing circuit 130 and an amplifier 140. The input pair circuit 110 is biased by a current source circuit 105, and outputs a signal S1 through a node N1 and a signal S2 through a node N2 according to an input signal VIP and an input signal VIN. In some embodiments, the input pair circuit 110 can include a transistor M1 and a transistor M2. The transistor M1 has a first terminal (for example, the source) coupled to the node N1 and outputting the signal S1, a second terminal (for example, the drain) coupled to the ground through the current source circuit 105, and a control terminal (for example, the gate) receiving the input signal VIP. The transistor M2 has a first terminal coupled to the node N2 and outputting the signal S2, a second terminal coupled to the second terminal of the transistor M1, and a control terminal (for example, the gate) receiving the input signal VIN. In some embodiments, the input signal VIP and the input signal VIN can be (but not limited to) a set of signals output by a pre-driver in a transmitter. In some embodiments, the set of signals may be (but not limited to) differential signals.

The protection circuit 120 is coupled to the input pair circuit 110, and operates according to multiple bias voltages VB1P, VB1N and VB so as to provide the input pair circuit 110 with voltage protection. The protection circuit 120 further transmits the signal S1 to a load RL1 to generate the output signal VOP, and transmits the signal S2 to a load RL2 to generate an output signal VON. In some embodiments, the bias voltage VB1P and the bias voltage VB1N can be voltages having a same level.

In some embodiments, the input pair circuit 120 includes multiple transistors M3 to M6. The transistor M3 has a first terminal coupled to the load RL1 to generate the output signal VOP, a second terminal coupled to a first terminal of the transistor M5, and a control terminal receiving the bias voltage VB1P. The transistor M3 can be biased by the bias voltage VB1P and generate the output signal VOP. The transistor M5 has a second terminal coupled to the first terminal of the transistor M1 to receive the signal S1, and a control terminal receiving the bias voltage VB. The transistor M5 can be biased by the bias voltage VB and receive the signal S1 from the input pair circuit 110. The transistor M4 has a first terminal coupled to the load RL2 to generate the output signal VON, a second terminal coupled to a first terminal of the transistor M6, and a control terminal receiving the bias voltage VB1N. The transistor M4 can be biased by the bias voltage VB1N and generate the output signal VON. The transistor M6 has a second terminal coupled to the first terminal of the transistor M2 to receive the signal S2, and a control terminal receiving the bias voltage VB. The transistor M6 can be biased by the bias voltage VB and receive the signal S2 from the input pair circuit 110.

As shown in FIG. 1, the input pair circuit 110 receives a supply voltage VDD through the protection circuit 120, the load RL1 and the load RL2. The input pair circuit 110 and the protection circuit 120 can be powered by the supply voltage VDD. With the configuration above, in some embodiments, the withstand voltage of the transistors (for example, the multiple transistors M1 to M6 above) included in each of the input pair circuit 110 and the protection circuit 120 is lower than the supply voltage VDD. For example, the supply voltage VDD is approximately 3.3 V, each of the multiple transistors M3 to M6 is an input/output (I/O) transistor having a withstand voltage of 1.8 V, and each of the transistors M1 and M2 can be a core transistor having a withstand voltage of 1.8 V. In general, the actual withstand voltage of an I/O transistor having a withstand voltage of 1.8 V is slightly lower than 1.8 V (for lower than 1.98 V), and the withstand voltage of a core transistor is lower than the withstand voltage of an I/O transistor. Thus, to prevent damage of the transistors M1 and M2, a stacked structure of the multiple transistors M3 to M6 can be used to withstand the supply voltage VDD.

The common mode sensing circuit 130 senses a level (to be referred to as a voltage VN1) of the first node N1 and a level (to be referred to as a voltage VN2) of the second node N2 to generate a feedback signal VFB. In some embodiments, the common mode sensing circuit 130 is used to capture a common mode level between the voltage VN1 and the voltage VN2. For example, the feedback signal VFB can be one half of a total of the voltage VN1 and the voltage VN2. In some embodiments, the common mode sensing circuit 130 can include a resistive element 131 and a resistive element 132, which can divide the voltages VN1 and the voltage VN2 so as to generate the feedback signal VFB. The resistive element 131 has a first terminal coupled to the node N2 so as to receive the voltage VN2. The resistive element 132 has a first terminal coupled to a second terminal of the resistive element 131 and generating the feedback signal VFB. The resistive element 132 has a second terminal coupled to the node N1 so as to receive the voltage VN1. In some embodiments, each of the resistive element 131 and the resistive element 132 can be implemented by a passive element. For example, the passive element can be (but not limited to) a polysilicon resistor. In some embodiments, each of the resistive element 131 and the resistive element 132 can be implemented by an active element. For example, the active element can be (but not limited to) a transistor.

In some selective embodiments, the common mode sensing circuit 130 further includes a capacitive element C (depicted by dotted lines, representing a selective configuration) coupled between the first terminal of the resistive element 132 and the ground. The capacitive element C can operate as a filter capacitor so as to better stabilize the feedback signal VFB.

The amplifier 140 has a negative input terminal coupled to the common mode sensing circuit 130 so as to receive the feedback signal VFB. The amplifier 140 has a positive input terminal receiving the reference voltage VREF. The amplifier 140 generates the bias voltage VB according to the reference voltage VREF and the feedback signal VFB. Ideally, the reference voltage VREF is equal to the feedback voltage VFB (for example, VREF=VFB=(VN1+VN2)/2). The feedback signal FVB also varies if a change occurs in the voltage VN1 and/or the voltage VN2. The amplifier 140 can adjust the bias voltage VB in response to the change in the feedback signal VFB, so that the voltage VN1 and/or the voltage VN2 restores to a predetermined level. Thus, it is ensured that the voltage VN1 and/or the voltage VN2 do not become overly high, hence preventing damage of the transistor M1 and the transistor M2.

In some embodiments, the reference voltage VREF is set to be slightly higher than or be equal to one half of a value of the withstand voltage of a core transistor (that is, the transistor M1 and/or the transistor M2). In an extreme situation, if the transistor M1 is turned on according to the input signal VIP and the transistor M2 is turned off according to the input signal VIN, the voltage VN1 is pulled to a low level by the current source circuit 105, and the voltage VN2 has a highest level. With the protection circuit 120, the common mode sensing circuit 130 and the amplifier 140 provided, the level of the voltage VN2 is clamped at a predetermined level, wherein the predetermined level can be determined by the reference voltage VREF and the voltage VN1. For example, the predetermined level can be represented as 2*VREF−VN1. Because the current source circuit 105 usually operates within a saturation region, the voltage VN1 is still kept to be higher than 0 V under influences of numerous variations (for example, process variations, voltage variations and temperature variations). As such, the predetermined level is lower than the value of the withstand voltage, thereby ensuring that the transistor M2 does not become damaged.

In some related techniques, a current mirror circuit similar to the configuration of the post driver is used to generate multiple bias voltages, in the aim of correctly biasing the post driver under the numerous variations. However, in these related techniques, connections of multiple transistors in the current mirror circuit are not completely identical to the connections of multiple transistors in a post driver, and so the bias voltage generated and the influence of the variances imposed on the post driver do not change in a completely linear manner. Moreover, a transistor and a diode in a diode-connected form existing in a current mirror circuit are coupled between a node providing a supply voltage and the ground, and as a result, a certain current is generated to cause additional power consumption. A resistance value of the resistor needs to be increased if reducing of the power consumption is desired. Thus, a circuit area can be significantly increased.

Compared to the technique above, in some embodiments of the present application, feedback control is performed on the levels (for example, the voltage VN1 and the voltage VN2) of internal nodes of the input pair circuit 110, so as to ensure that the post driver 100 can be more accurately biased even under the influences of numerous variations, and to ensure that the voltage withstood by each of the transistors M1 to M6 does not exceed the value of respective withstand voltage. Moreover, a constant current (if any) generated by the common mode sensing circuit 130 and the amplifier 140 can be lower than a fixed current generated by a current mirror circuit using the techniques above, hence achieving lower power consumption.

Figure 2:
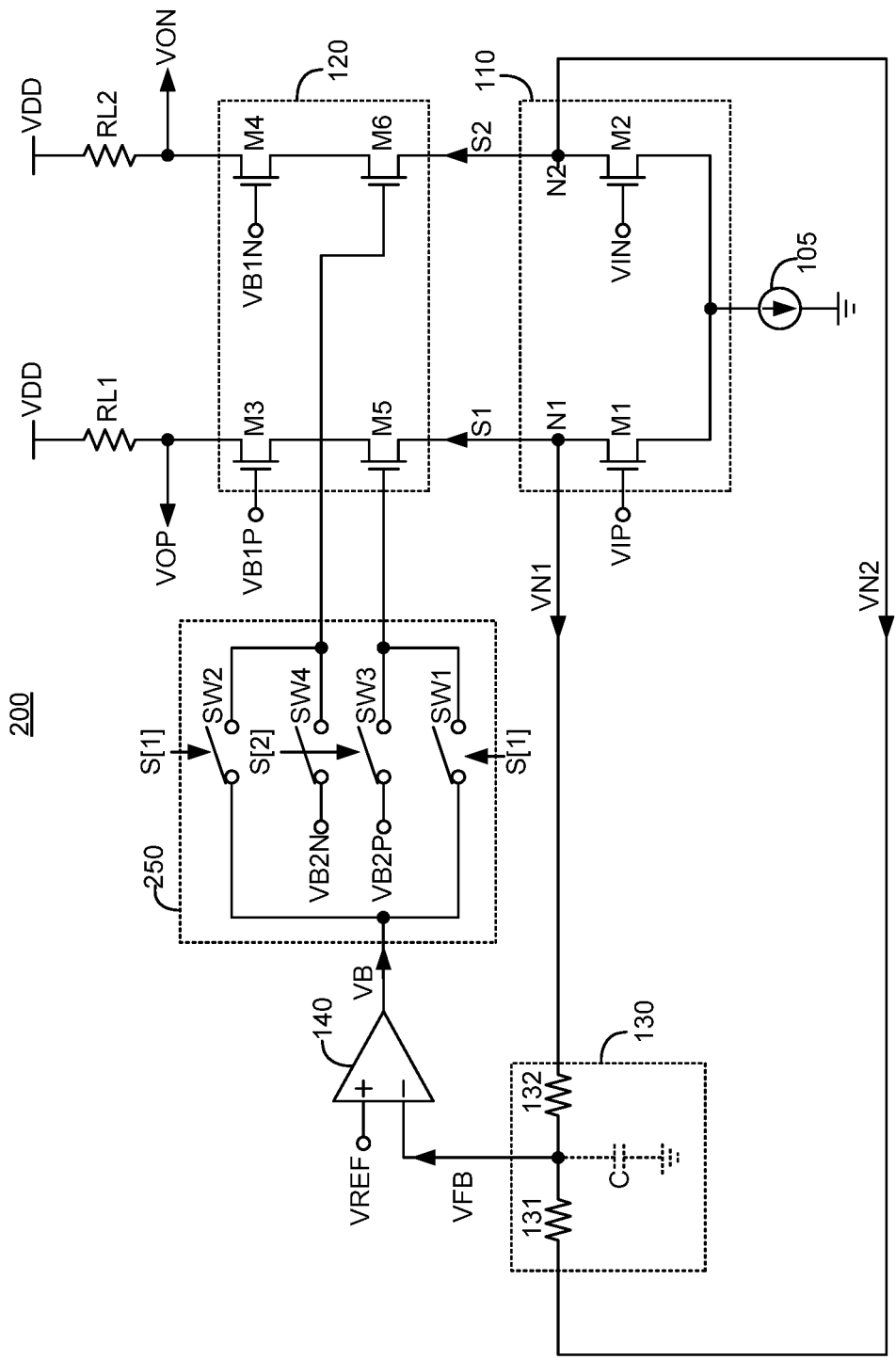
FIG. 2 is a schematic diagram of a post driver according to some embodiments of the present application.

FIG. 2 shows a schematic diagram of a post driver 200 according to some embodiments of the present application. Compared to FIG. 1, the post circuit 200 of this example further includes a switching circuit 250. The switching circuit 250 selectively outputs one of the bias voltage VB and a fixed voltage (for example, the bias voltage VB2P and the bias voltage VB2N) to the protection circuit 120.

More specifically, the switching circuit 250 includes multiple switches SW1 to SW4. The switch SW1 is coupled between the amplifier 140 and the control terminal of the transistor M5, and is selectively turned on according to a control signal S[1] so as to transmit the bias voltage VB to the transistor M5. The switch SW2 is coupled between the amplifier 140 and the control terminal of the transistor M6, and is selectively turned on according to the control signal S[1] so as to transmit the bias voltage VB to the transistor M6. The switch SW3 has a first terminal receiving the bias voltage VB2P, and a second terminal coupled to the control terminal of the transistor M5. The switch SW3 is selectively turned on according to a control signal S[2] so as to transmit the bias voltage VB2P to the transistor M5. The switch SW4 has a first terminal receiving the bias voltage VB2N, and a second terminal coupled to the control terminal of the transistor M6. The switch SW4 is selectively turned on according to the control signal S[2] so as to transmit the bias voltage VB2P to the transistor M6. In some embodiments, the bias voltage VB2N and the bias voltage VB2P can be voltages having a same level. In some embodiments, the multiple bias voltages VB1N, VB1P, VB2N and VB2P can be generated by dividing the power voltage VDD.

In some embodiments, the control signal S[1] and the control signal S[2] have opposite logical values, so that the multiple switches SW1 and SW2 and the multiple switches SW3 and SW4 have opposite on states. For example, when the multiple switches SW1 and SW2 are turned on, the multiple switches SW3 and SW4 are not turned on, and vice versa. With the switching circuit 250, the adjustability of the post driver 200 is improved. For example, during testing or adjusting, different bias voltages can be input to the protection circuit 120 by using the switching circuit 250. In some embodiments, when the post driver 200 enters a power-saving mode, the current source circuit 105 is turned off so as to save power consumption. As a result, the voltage VN1 and the voltage VN2 are increased. Under such condition, the switching circuit 250 can output a fixed voltage (for example, the bias voltage VB2P and the bias voltage VB2N) to the protection circuit 120, so as to ensure that the transistor M1 and the transistor M2 are not damaged. That is to say, in an operating mode, the switching circuit 250 turns on the switches SW1 and SW2 and turns off the switches SW3 and SW4 so as to provide the bias voltage VB to the protection circuit; in a power-saving mode or a test mode, the switching circuit 250 turns on the switches SW3 and SW4 and turns off the switches SW1 and SW2 so as to output a fixed voltage to the protection circuit 120.

Figure 3:
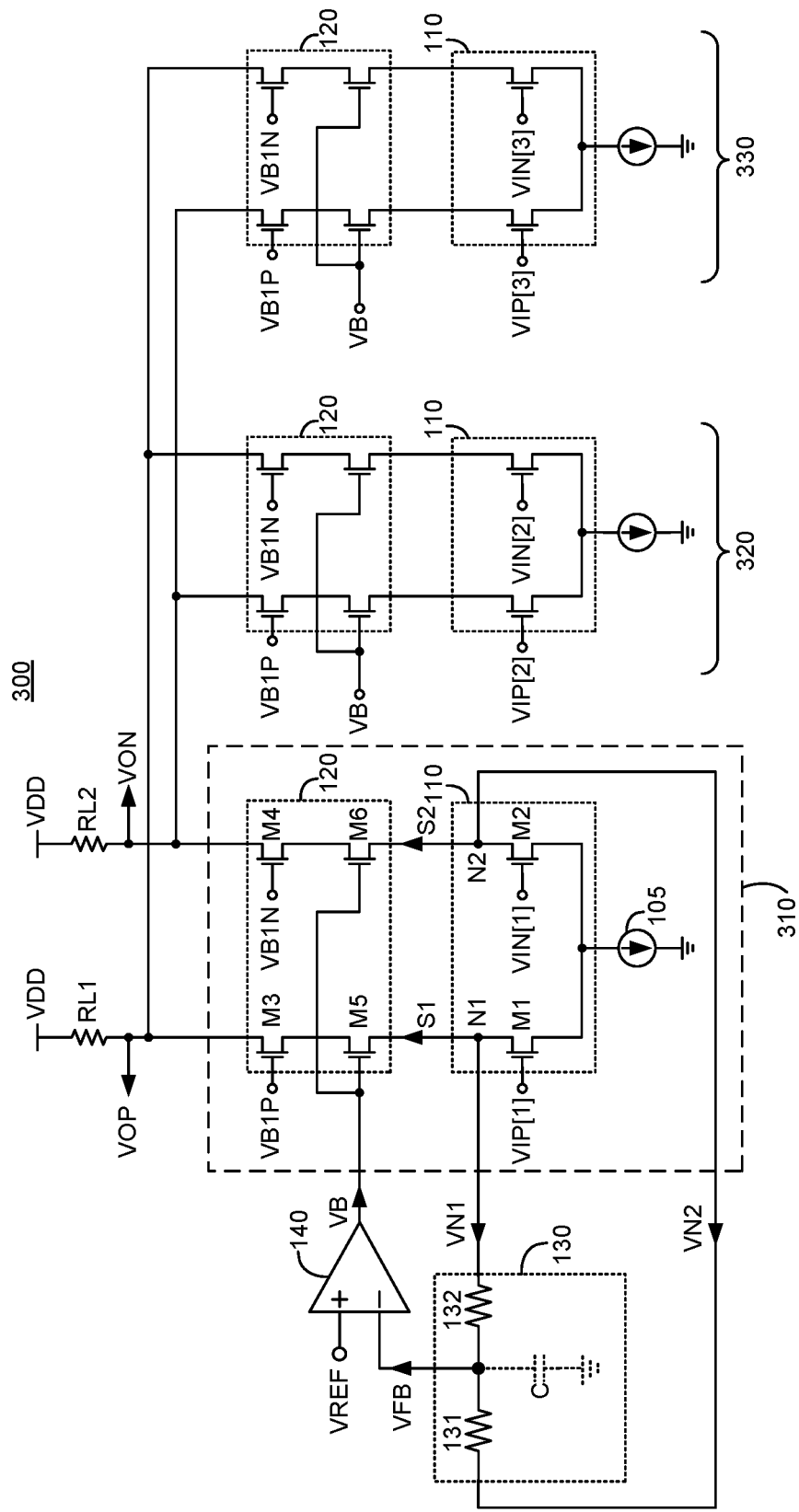
FIG. 3 is a schematic diagram of a post driver according to some embodiments of the present application.

FIG. 3 shows a schematic diagram of a post driver 300 according to some embodiments of the present application. Compared to the example in FIG. 1 or FIG. 2, the post driver 300 can perform a pre-emphasis or de-emphasis function so as to adapt to requirements for high-speed transmission applications.

The post driver 300 includes driving circuits 310, 320 and 330 in multiple stages. In some embodiments, the driving circuits 310, 320 and 330 in multiple stages respectively correspond to multiple taps, wherein the driving circuit 310 corresponds to a main tap among these taps. Multiple sets of signals received by the driving circuits 310, 320 and 330 are sequentially an input signal VIP[1] and an input signal VIN[1], an input signal VIP[2] and an input signal VIN[2], and an input signal VIP[3] and an input signal VIN[3]. In some embodiments, two among the input signal VIP[1], the input signal VIP[2] and the input signal VIP[3] have a predetermined time difference in between. For example, the input signal VIP[1] can be represented as VIP[t] (that is, an input signal VIP at a timing t), the input signal VIP[2] can be represented as VIP[t−1] (that is, an input signal VIP at a timing t−1), and the input signal VIP[3] can be represented as VIP[t+1] (that is, an input signal VIP at a timing t+1). Alternatively, in another example, the input signal VIP[1] can be represented as VIP[t], the input signal VIP[2] can be represented as VIP[t−1], and the input signal VIP[3] can be represented as VIP[t−2] (that is, an input signal VIP at a timing t−2). The relations among the input signal VIN[1], the input signal VIN[2] and the input signal VIN[3] can be referred from those of the input signal VIP[1], the input signal VIP[2] and the input signal VIP[3], and are omitted herein for brevity.

The driving circuits 310, 320 and 330 generate, according to the multiple sets of input signals, the output signal VOP through a load RL1 and the output signal VON through a load RL2. The circuit structure of each of the driving circuits 310, 320 and 330 can be referred from that of the post driver 100 in FIG. 1, and associated details are omitted herein for brevity. Sizes of respective transistors and/or currents of respective current source circuits of the driving circuits 310, 320 and 330 are different from one another. For example, because the driving circuit 310 corresponds to the main tap, compared to the remaining driving circuits 320 and 330, multiple transistors M1 to M6 in the driving circuit 310 have the largest sizes (or the largest number connected in parallel), and the current source circuit 105 in the driving circuit 310 has the largest current.

In this example, the common mode sensing circuit 130 generates the feedback signal VFB according to the level of the node N1 and the level of the node N2 in the driving circuit 310 corresponding to the main tap, so as to provide the feedback signal VFB to the amplifier 140 to further generate the bias voltage VB. In other words, in this example, the multiple driving circuits 310, 320 and 330 corresponding to the multiple taps can share the common mode sensing circuit 130 and the amplifier 140. In addition, The output of the driving circuit 310 corresponding to the main tap and the outputs of the driving circuits 320 and 330 corresponding to other taps are opposite. For example, as shown in FIG. 3, the positive output terminal of the driving circuit 310 (equivalent to the first terminal of the transistor M3) is coupled to the negative output terminals of the driving circuits 320 and 330 to generate the output signal VOP through the load RL1, and the negative output terminal of the driving circuit 310 (equivalent to the first terminal of the transistor M4) is coupled to the positive output terminals of the driving circuits 320 and 330 to generate the output signal VON through the load RL2. In other words, the positions of the node N1 and node N2 within the driving circuits 320 and 330 and the positions of the node N1 and node N2 within the driving 310 are opposite to each other.

It should be noted that the number of input-stage circuits above is an example, and is not to be construed as a limitation to the present application. According to actual application requirements, the number of taps needed may be different, and so the number of driving circuits in the post driver 300 can also be correspondingly adjusted. In some other embodiments, each of the driving circuits 310, 320 and 330 may further include the switching circuit 250 in FIG. 2, so as to improve the adjustability of the post driver 300.

In conclusion, the post driver according to some embodiments of the present application can generate an appropriate bias voltage by means of feedback control, so as to ensure that transistors in the post driver are not damaged. Thus, transistors of low-voltage processes can be implemented in the post driver. Moreover, in practice, if a pre-emphasis or de-emphasis function is needed, the post driver according to some embodiments of the present application can utilize circuits in multiple stages to implement multiple taps in an equalizer so as to realize the function above, and these circuits in multiple stages can share some circuits so as to reduce a circuit area.

While the present application has been described by way of example and in terms of the preferred embodiments, it is to be understood that the present application is not limited thereto. Various modifications made be made to the technical features of the present application by a person skilled in the art on the basis of the explicit or implicitly disclosures of the present application. The scope of the appended claims of the present application therefore should be accorded with the broadest interpretation so as to encompass all such modifications.

What is claimed is:

1. A post driver, comprising:
   an input pair circuit, outputting a first signal through a first node and outputting a second signal through a second node according to a first input signal and a second input signal;
   a protection circuit, providing the input pair circuit with voltage protection according to a plurality of first bias voltages and a second bias voltage, transmitting the first signal to a first load to generate a first output signal, and transmitting the second signal to a second load to generate a second output signal;
   a common mode sensing circuit, sensing a level of the first node and a level of the second node to generate a feedback signal;
   an amplifier, generating the second bias voltage according to a reference voltage and the feedback signal; and
   a switching circuit, selectively outputting one of the second bias voltage and a fixed voltage to the protection circuit.

2. The post driver according to claim 1, wherein the switching circuit outputs the fixed voltage to the protection circuit in a power-saving mode, and outputs the second bias voltage to the protection circuit in an operating mode.

3. The post driver according to claim 1, wherein the common mode sensing circuit comprises:
   a first resistive element, having a first terminal coupled to the second node; and
   a second resistive element, having a first terminal coupled to a second terminal of the first resistive element and generating the feedback signal, and a second terminal coupled to the first node.

4. The post driver according to claim 1, wherein the input pair circuit comprises:
   a first transistor, having a first terminal coupled to the first node and outputting the first signal, a second terminal coupled to a ground through a current source circuit, and a control terminal receiving the first input signal; and
   a second transistor, having a first terminal coupled to the second node and outputting the second signal, a second terminal coupled to the second terminal of the first transistor, and a control terminal receiving the second input signal.

5. The post driver according to claim 4, wherein when the second transistor is turned off in response to the second input signal, a level of the second node is clamped to a predetermined level by the protection circuit, the common mode sensing circuit and the amplifier, wherein the predetermined level is determined according to the reference voltage and the level of the first node.

6. The post driver according to claim 1, wherein the protection circuit comprises:
   a first transistor, biased by a first one among the plurality of first bias voltages, and generating the first output signal;
   a second transistor, biased by the second bias voltage, and receiving the first signal from the input pair circuit;
   a third transistor, biased by a second one among the plurality of first bias voltages, and generating the second output signal; and
   a fourth transistor, biased by the second bias voltage, and receiving the second signal from the input pair circuit.

* * * * *